(12) United States Patent
Luo et al.

(10) Patent No.: US 11,658,130 B2
(45) Date of Patent: May 23, 2023

(54) CONDUCTIVE PLATE STRESS REDUCTION FEATURE

(71) Applicant: Texas Instruments Incorporated, Dallas, TX (US)

(72) Inventors: Tianyi Luo, Allen, TX (US); Jonathan Almeria Noquil, Plano, TX (US); Satyendra Singh Chauhan, Murphy, TX (US); Osvaldo Jorge Lopez, Annandale, NJ (US); Lance Cole Wright, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,981

(22) Filed: Dec. 31, 2020

(65) Prior Publication Data

US 2022/0208692 A1 Jun. 30, 2022

(51) Int. Cl.
| | |
|---|---|
| *H01L 23/00* | (2006.01) |
| *H01L 23/31* | (2006.01) |
| *H01L 23/495* | (2006.01) |
| *H01L 21/56* | (2006.01) |
| *H01L 21/48* | (2006.01) |

(52) U.S. Cl.
CPC ........ *H01L 23/562* (2013.01); *H01L 21/4825* (2013.01); *H01L 21/565* (2013.01); *H01L 23/3107* (2013.01); *H01L 23/4952* (2013.01); *H01L 23/49513* (2013.01); *H01L 23/49562* (2013.01); *H01L 23/49575* (2013.01)

(58) Field of Classification Search
CPC ............... H01L 23/562; H01L 23/3107; H01L 23/49513; H01L 23/4952; H01L 23/49562; H01L 23/49575; H01L 21/4825; H01L 21/565
See application file for complete search history.

(56) References Cited

U.S. PATENT DOCUMENTS

| | | | |
|---|---|---|---|
| 2003/0106212 A1* | 6/2003 | Chao ..................... | H01L 21/565 29/841 |
| 2015/0243587 A1* | 8/2015 | Yang ................. | H01L 23/49524 257/669 |

* cited by examiner

*Primary Examiner* — Marc Anthony Armand
(74) *Attorney, Agent, or Firm* — Ronald O. Neerings; Frank D. Cimino

(57) ABSTRACT

A packaged electronic device includes a semiconductor die, a conductive plate coupled to a lead, a solder structure and a package structure. The semiconductor die has opposite first and second sides and a terminal exposed along the second side. The conductive plate has opposite first and second sides and an indent that extends into the first side, the conductive plate, and the solder structure extends between the second side of the semiconductor die and the first side of the conductive plate to electrically couple the conductive plate to the terminal, and the solder structure extends into the indent. The package structure encloses the semiconductor die, the conductive plate and a portion of the lead.

30 Claims, 14 Drawing Sheets

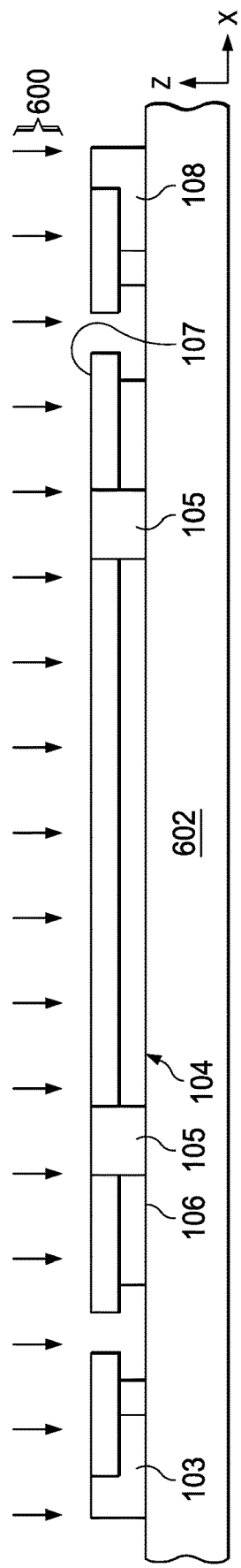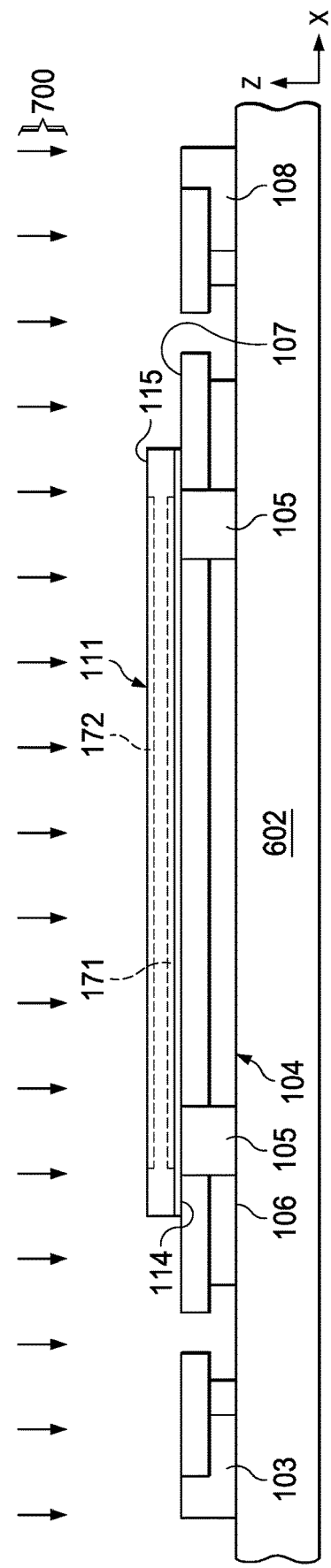

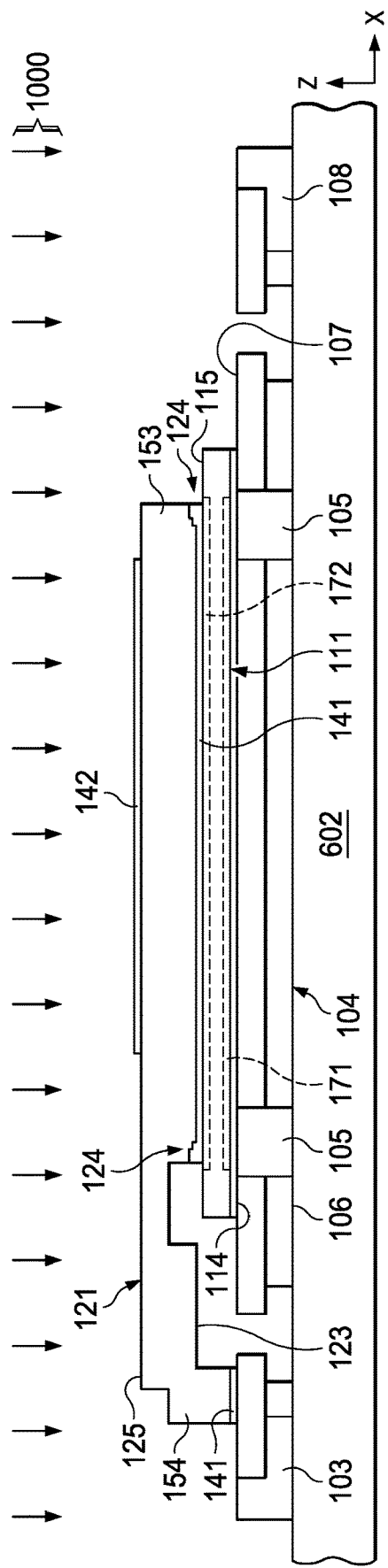
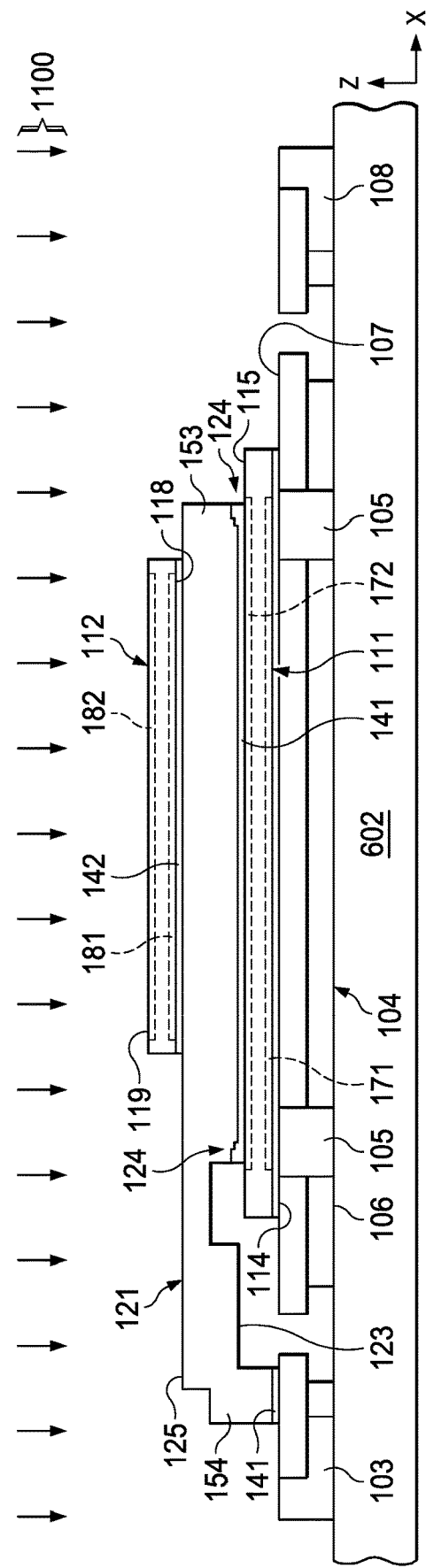
FIG. 10
FIG. 11

CONDUCTIVE PLATE STRESS REDUCTION FEATURE

BACKGROUND

Conductive plates, such as clips, are used for electrical connections between dies and leads in packaged electronic devices having stacked arrangements. Conductive plates are often used for connection of power switching transistor source and drain terminals of high and low side switching transistor configurations to provide a single chip DC to DC converter solution with high current carrying capability. Low drain to source on-state resistance (Rdson) is important for efficient operation of switching power converters. Certain fabrication process steps involve thermal cycling during electronic device manufacturing. Mismatching of the coefficient of thermal expansion (CTE) between the semiconductor die and the conductive metal plate can lead to damage or cracking of the solder joint along a bond line interface between the conductive plate and a transistor semiconductor die during reliability testing or field use which exposes the product to temperature excursion and increases the Rdson. The volume of solder can be increased to increase the bond line thickness (BLT), but this increases cost, and may not prevent cracking, particularly where the BLT varies along the length of the interface between the die and the plate. A dimple can be incorporated on the plate to ensure a minimum BLT, but this also increases the production cost.

SUMMARY

In one aspect, a packaged electronic device includes a semiconductor die, a conductive plate, one or more leads, a solder structure and a package structure. The semiconductor die has opposite first and second sides and a terminal exposed along the second side. The conductive plate has opposite first and second sides and an indent that extends into the first side. The solder structure extends between the second side of the semiconductor die and the first side of the conductive plate and into the indent, and the solder structure electrically couples the conductive plate to the terminal.

In another aspect, a method of manufacturing a packaged electronic device includes forming an indent in a side of a conductive plate, depositing solder on a side of a semiconductor die, engaging the side of the conductive plate with the solder to form a solder structure that extends into the indent and between the side of the semiconductor die and the side of the conductive plate. The method also includes heating the solder to electrically couple the conductive plate to a terminal exposed along the side of the semiconductor die and forming a package structure that encloses the semiconductor die and the conductive plate.

In another aspect, a conductive plate includes a first portion, a leg portion and an indent. The first portion has a first side in a first plane and an opposite second side in a parallel second plane. The second side is spaced apart from the first side along a direction orthogonal to the first and second planes. The leg portion extends along a leg direction from the first portion past the first plane and away from the second plane. The indent extends into the first side of the first portion along the direction.

BRIEF DESCRIPTION OF THE DRAWINGS

FIG. 6 is a partial end elevation view of a portion of a lead frame with die attach pad and lead features on a carrier tape.

FIG. 7 is a partial end elevation view of a first semiconductor die attached to the die attach pad of the lead frame of FIG. 6.

FIG. 10 is a partial end elevation view of a second solder structure dispensed on a top side of the first conductive plate.

FIG. 11 is a partial end elevation view of a second semiconductor die attached to the top side of the first conductive plate.

DETAILED DESCRIPTION

Figure 1:
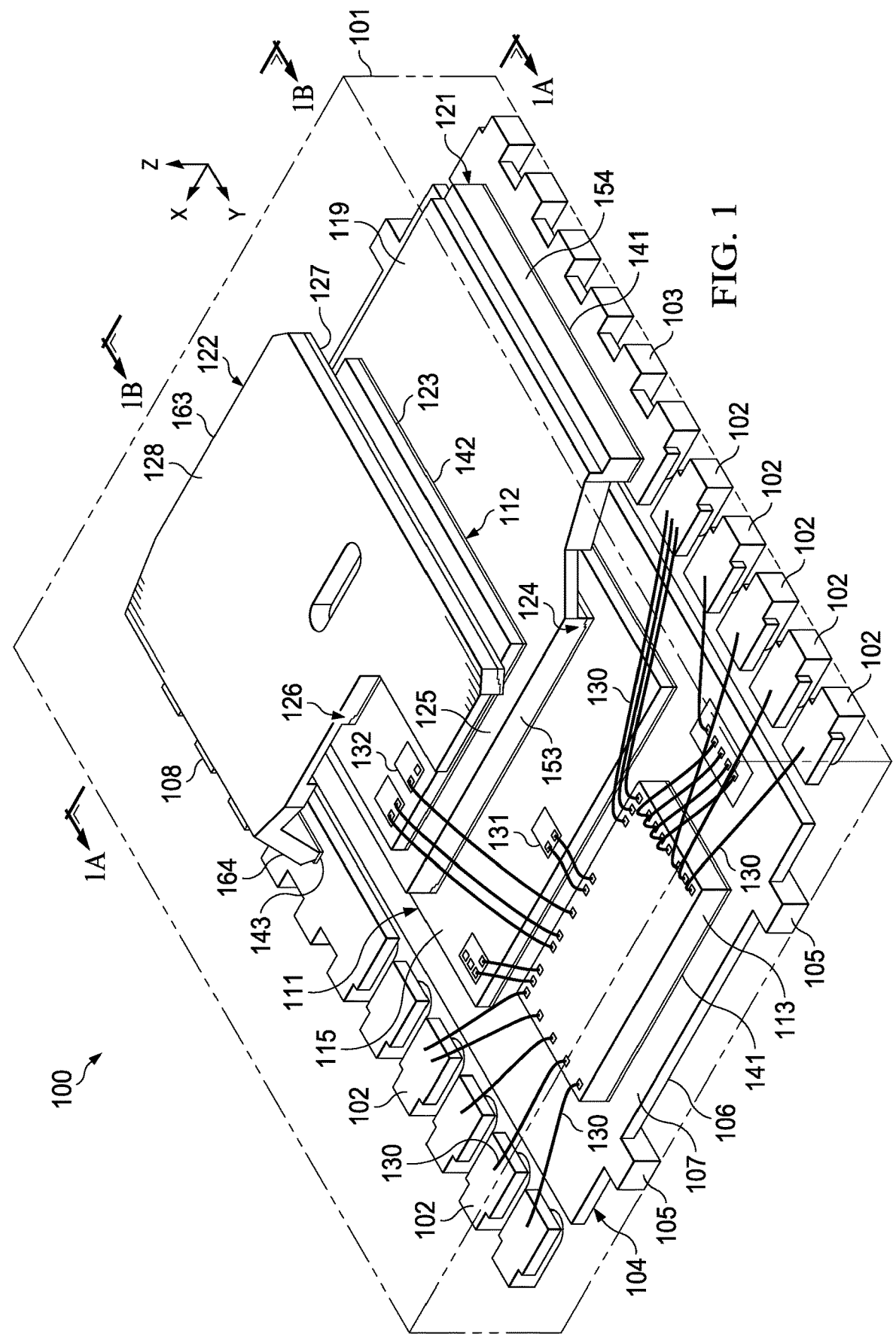
FIG. 1 is a perspective view of a stack clip power stage packaged electronic device according to an embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
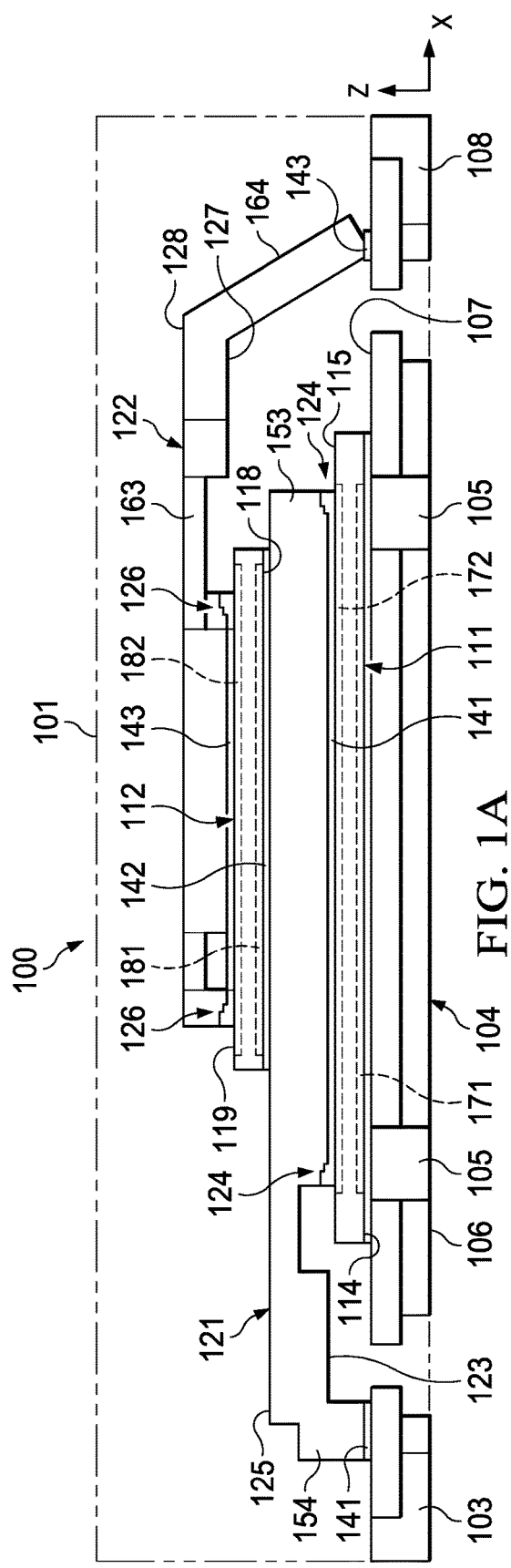
FIG. 1A is a sectional end elevation view of the packaged electronic device taken along line A-A in FIG. 1.
Figure 1B:
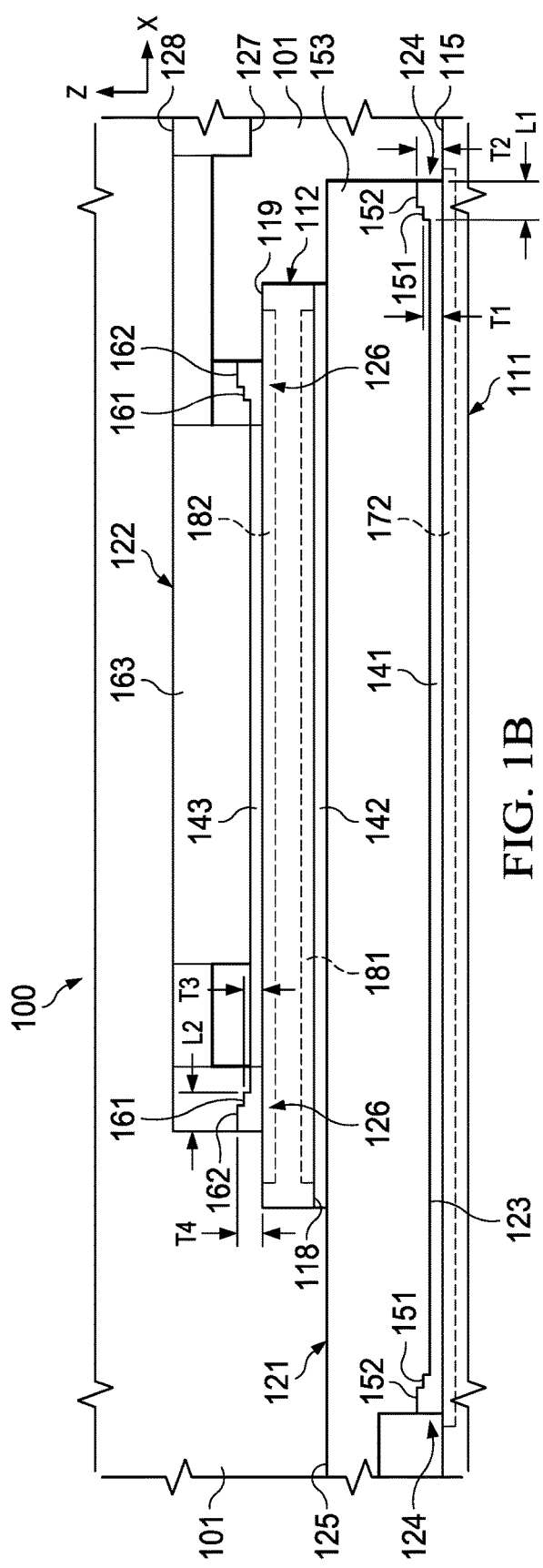
FIG. 1B is a partial sectional end elevation view of the packaged electronic device taken along line B-B in FIG. 1.

Referring initially to FIGS. 1, 1A, 1B and 2, FIG. 1 shows a packaged electronic device 100 having a package structure 101. The packaged electronic device 100 is a stacked configuration having multiple semiconductor dies, multiple conductive plates, a die attach pad and lead portions of a starting lead frame. The example packaged electronic device 100 is a stack clip power stage with a quad flat no-lead (QFN) package shape. In another example, the packaged electronic device has a different shape. FIG. 1A shows a sectional end view of the packaged electronic device 100 taken along line A-A in FIG. 1, and FIG. 1B shows a partial sectional end view of the packaged electronic device 100 taken along line B-B in FIG. 1. The packaged electronic device 100 has individual leads 102 disposed along portions of two lateral sides of the package structure 101, as well as a combined first lead 103 that joins several lead positions of the QFN package shape along one side of the packaged electronic device 100.

The packaged electronic device 100 also includes a die attach pad 104 with tie bars 105 that extend outward therefrom. The die attach pad has a planar bottom or first side 106 and an opposite, generally planar top or second side 107. Also, a combined second lead 108 joins several other lead positions of the QFN package shape along another side of the packaged electronic device 100. The individual leads 102, the first lead 103, the second lead 108, the die attach pad 104 and the tie bars 105 are generally coplanar copper or aluminum structures that extend in a plane formed by a first direction X and an orthogonal second direction Y. In one example, the leads 102, the first lead 103, the second lead 108, the die attach pad 104 and the tie bars 105 have a generally uniform thickness. In another example, one or more of these features include undercut or half-etch features (not shown), for example, to facilitate adhesion of subsequently formed molding compound of the package structure 101 and prevent separation or delamination of the package structure 101 from the structures of one or more of the leads 102, the first lead 103, the second lead 108, the die attach pad 104 and the tie bars 105.

The packaged electronic device 100 includes a first semiconductor die 111 having a first (e.g., low side) n-channel field effect transistor (FET), a second semiconductor die 112 having a second (e.g., high side) n-channel FET and a third semiconductor die 113 that provides pulse width modulated (PWM) switching control signals to the transistors of the respective first and second semiconductor dies 111 and 112. As best shown in FIG. 1A, the first semiconductor die 111 has a bottom or first side 114 and an opposite top or second side 115. The second semiconductor die 112 has a bottom or first side 118 and an opposite top or second side 119.

The packaged electronic device 100 includes a first conductive plate 121 and a second conductive plate 122. As further shown in FIG. 1A, the first conductive plate 121 has a bottom or first side 123, an indent 124 that extends upward along the Z direction into the first side 123 and an opposite top or second side 125. The first conductive plate 121 is electrically coupled to the combined first lead 103. The second conductive plate 122 has a second indent 126 that extends into a bottom or first side 127 thereof, and an opposite top or second side 128. The second conductive plate 122 is electrically coupled to the combined second lead 108.

Figure 2:
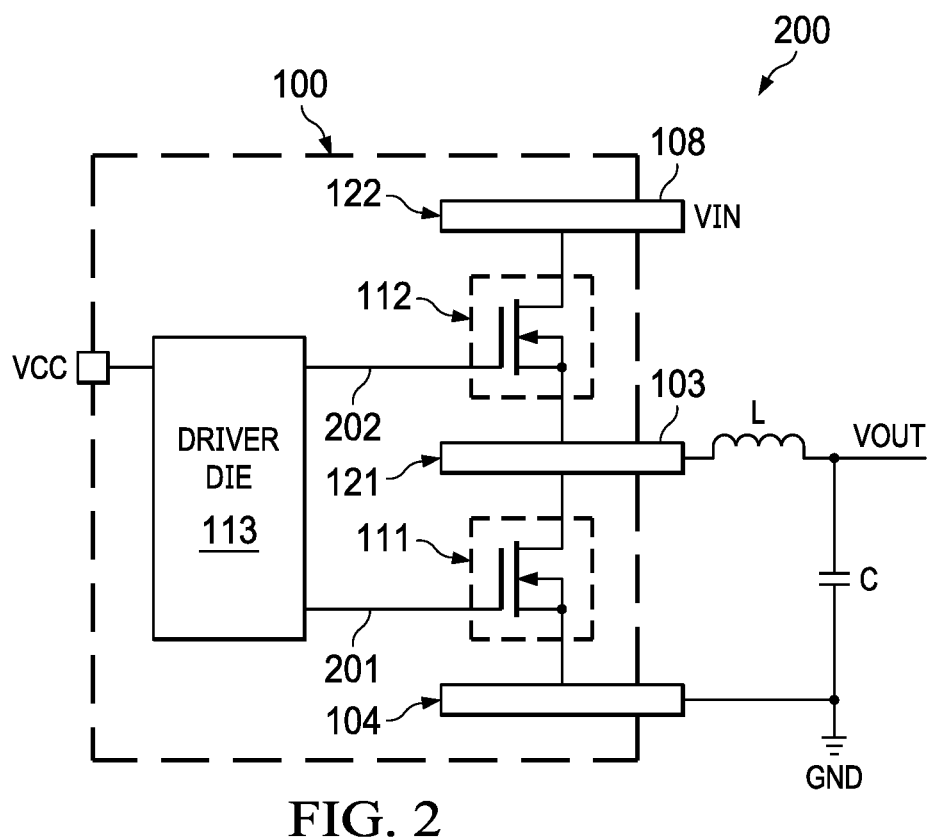
FIG. 2 is a partial schematic diagram of a DC to DC converter circuit including the packaged electronic device of FIG. 1.
Figure 3:
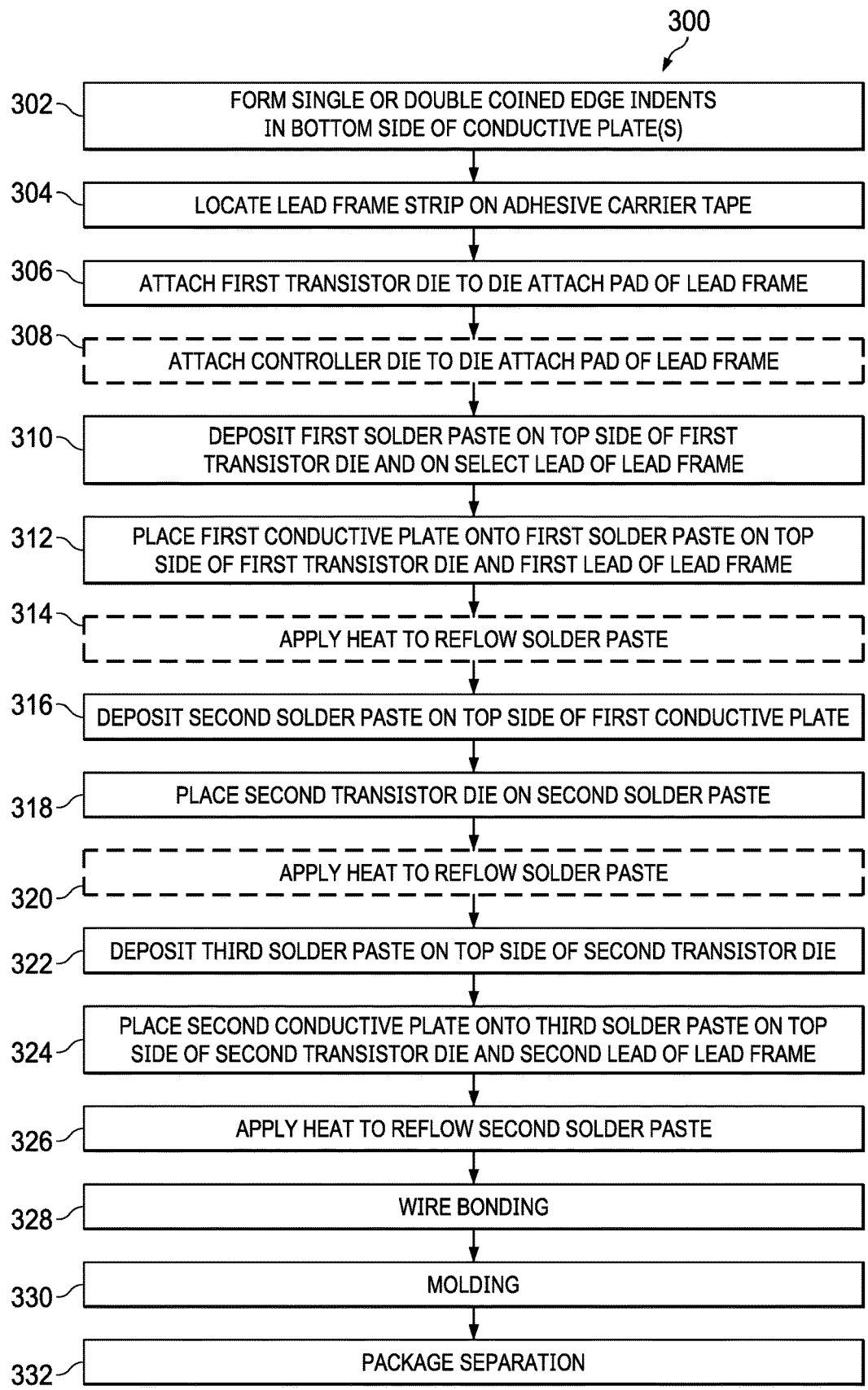
FIG. 3 is a flow diagram of a method of manufacturing a packaged electronic device according to another embodiment.

The packaged electronic device 100 also includes bond wires 130 that electrically couple various conductive features 131 and 132 (e.g., bond pads) of the semiconductor dies 111, 112 and 113 with one another and with respective ones of the leads 102 as shown in FIG. 1. These interconnections and electrical coupling provided by the die attach pad 104, the conductive plates 121 and 122 and the respective combined first and second leads 103 and 108 form an electrical circuit which can be combined with other electronic components (e.g., an output inductor) on a host printed circuit board (PCB) to form a DC to DC converter as illustrated in FIG. 2.

In addition to bond wire interconnections, the electrical circuit connections include a first solder structure 141, a second solder structure 142 and a third solder structure 143. The first solder structure 141 extends between the second side 115 of the semiconductor die 111 and the first side 123 of the conductive plate 121. A first portion of the first solder structure 141 extends laterally to a lateral edge of the conductive plate 121 and into the first indent 124 between the second side 115 of the semiconductor die 111 and the first side 123 of the conductive plate 121. The second solder structure 142 extends between the first side 118 of the second semiconductor die 112 and the second side 125 of the conductive plate 121. A first portion of the third solder structure 143 extends between the second side 119 of the second semiconductor die 112 and the first side 127 of the second conductive plate 122.

As best shown in FIG. 1B, the first indent 124 extends inward from two or more lateral edges of the first conductive plate 121 by a lateral length L1 (e.g., 125 μm). The first indent 124 in this example includes a first step 151 that extends into the first side 123 of the first conductive plate 121 by a first distance T1 (e.g., 20 μm), and a second step 152 adjacent the step 151. In another example, the first indent 124 includes a single step 151. In another example, the first indent 124 has a curved shape. The second step 152 in the illustrated example extends into the first side 123 of the conductive plate 121 by a second distance T2 (e.g., 40 μm) that is greater than the first distance T1. In one example, the first indent 124 extends along two lateral edges of the first portion of the first conductive plate 121 as shown in FIG. 1B.

The first conductive plate 121 includes a first portion 153 that includes the first side 123 in a first plane (e.g., an X-Y plane in FIGS. 1, 1A and 1B) and the second side 125 in a second plane (e.g., a second X-Y plane). The first and second planes are parallel to one another, and the second side 125 is spaced apart from the first side 123 along the Z direction, which is orthogonal to the first and second planes. The first portion 153 of the first conductive plate 121 also includes a leg portion 154 that extends along a leg direction (e.g., the negative Z direction) from the first portion 153 past the first plane and away from the second plane. A second portion of the first solder structure 141 extends between a bottom side of the leg portion 154 and the combined first lead 103 to electrically couple the first conductive plate 121 to the first lead 103.

As further shown in FIG. 1B, the second indent 126 of the second conductive plate 122 includes a first step 161 and a second step 162 adjacent the first step 161. The second indent 126 extends by a lateral length L2 (e.g., 125 μm). The first step 161 in this example extends into the first side 127 of the second conductive plate 122 by a third distance T3

(e.g., 20 μm), and the second step 162 extends into the first side 127 of the second conductive plate 122 by a fourth distance T4 (e.g., 40 μm) that is greater than the third distance T3. In another example, the second indent 126 includes a single step 161. In another example, the second indent 126 has a curved shape.

The second conductive plate 122 includes a first portion 163 that includes the first side 127 in a third plane (e.g., an X-Y plane in FIGS. 1, 1A and 1B) and the second side 128 in a fourth plane (e.g., a fourth X-Y plane). The third and fourth planes are parallel to one another in this example, and the second side 128 is spaced apart from the first side 127 along the Z direction. The first portion 163 of the second conductive plate 122 also includes a leg portion 164 that extends along a second leg direction that is at a non-zero angle to the Z direction, from the first portion 163 past the third plane and away from the fourth plane. A second portion of the third solder structure 143 extends between a bottom side of the leg portion 164 and the combined second lead 108 to electrically couple the second conductive plate 122 to the second lead 108.

The first semiconductor die 111 includes a conductive first terminal 171 exposed along the first side 114 thereof to provide electrical connection to a drain of the n-channel FET of the first semiconductor die 111, as well as a conductive second terminal 172 exposed along the second side 115 to provide electrical connection to a source of the low side n-channel FET. The terminals 171 and 172 are shown in dashed or phantom lines in FIGS. 1A and 1B. The first terminal 171 is electrically coupled to the second side 107 of the die attach pad 104. The first portion of the first solder structure 141 extends between the second side 115 of the semiconductor die 111 and the first side 123 of the first conductive plate 121 to electrically couple the first conductive plate 121 to the second terminal 172 exposed along the second side 115 of the semiconductor die 111. The first portion of the first solder structure 121 extends into the first indent 124.

The second semiconductor die 112 has a conductive first terminal 181 and a conductive second terminal 182, shown in dashed or phantom lines in FIGS. 1A and 1B. The first terminal 181 is exposed along the first side 118 of the second semiconductor die 112. The second terminal 182 is exposed along the second side 119 of the second semiconductor die 112. The first terminal 181 provides an electrical connection for a drain of the high side n-channel FET of the second semiconductor die 111 to the first conductive plate 121. The second terminal 182 provides an electrical connection to a source of the high side n-channel FET of the second semiconductor die 112. The second solder structure 142 extends between the first side 118 of the second semiconductor die 112 and the second side 125 of the first conductive plate 121 to electrically couple the conductive plate 121 to the first terminal 181 of the second semiconductor die 112.

The first portion of the third solder structure 143 extends between the second side 119 of the second semiconductor die 112 and the first side 127 of the second conductive plate 122 to electrically couple the second conductive plate 122 to the first terminal 181 of the second semiconductor die 112, where the first portion of the third solder structure 143 extends into the second indent 126. The second portion of the third solder structure 143 extends between the bottom side of the leg portion 164 and the combined second lead 103 to electrically couple the second conductive plate 122 to the combined second lead 108.

The package structure 101 in one example is a molding compound structure that encloses the semiconductor dies 111 and 112, the first and second conductive plates 121, portions of the leads 102, 103 and 108, and portions of the die attach pad 104 and the tie bars 105. The package structure exposes portions of the leads 102, 103 and 108, and portions of the die attach pad 104 and the tie bars 105 along respective sides and a bottom side of the packaged electronic device to allow soldering of these features to conductive pads of a host PCB (not shown).

FIG. 2 shows a DC-DC converter circuit 200 that includes the packaged electronic device 100 as well as an output inductor L and an output capacitor C. The first semiconductor die 111 provides a low side FET, the second semiconductor die 112 provides a high side FET and the third semiconductor die 113 is a driver die with a connection to a supply voltage VCC and gate drive outputs to control the high and low side FETs. The leads 103 and 108 and the die attach pad 104 are soldered to a PCB (not shown) in one example, along with the terminals or leads of the passive components L and C to form the DC to DC converter electrical circuit. In this example, the leads 102 (FIG. 1) are also soldered to the PCB.

In this example, the first semiconductor die 111 includes a low side n-channel FET with a source coupled to the bottom terminal of the capacitor C having a ground or circuit reference voltage labeled GND via the die attach pad 104. The low side n-channel FET has a gate 201 coupled by a bond wire (FIG. 1) to a low side gate drive output of the third semiconductor die 113. The drain of the low side n-channel FET of the first semiconductor die 111 is coupled to a source of the high side n-channel FET of the second semiconductor die 112 and a terminal of the inductor L via the first conductive plate 121. The high side n-channel FET has a gate 202 coupled by another bond wire to a high side gate drive output of the third semiconductor die 113. The drain of the high side FET is coupled to an input voltage signal VIN. The driver circuitry of the third semiconductor die 113 generates alternating PWM switching control signals to charge the inductor L and then discharge the inductor L to charge the capacitor C and regulate an output voltage VOUT across the capacitor C.

The conductive plates 121 and 122 are soldered to the sides 123 and 127 of the respective semiconductor dies 111 and 112 and the solder structures 141 and 143 to facilitate high current carrying capability of the respective low and high side FETs. Cracking of the solder structures 141 and/or 143 can increase the Rdson of one or both of the low and high side FET in the respective first and second semiconductor dies 111 and 112. The indents 124 and 126 of the first sides of the respective first and second conductive plates 121 and 122 mitigate solder joint cracking in the packaged electronic device 100 by providing a thicker bond line thickness (BLT) at one or more select locations of the respective solder structures 141 and 143. In one example, the indents 124 and 126 are double coined steps that increase the local solder thickness. In this example, moreover, the first indent 124 extends to a lateral edge of the first conductive plate 121 to enhance the BLT at the location where solder cracking is most likely to begin. In another example, one or both indents 124 and 126 includes single coined or single step shapes. In other implementations, one or both indents 124 and 126 includes slant edge coined shapes or radius edge coined clip head shapes (not shown).

Solder is prone to crack at a thinner BLT. The indents 124 and 126 help ensure a desired minimum BLT. Also, the indents 124 and 126 can be provided at any desired location or locations. In one example, the first indent 124 extends at every corner or edge of the interface between the first conductive plate 121 and the first semiconductor die 111. The indents 124 and 126 provide uniform BLT even in the event of plate tilting during manufacturing to ensure a minimum BLT that mitigates or prevents cracking during thermal processing to provide advanced device reliability and improve performance. The benefits are applicable to all forms of packaged electronic devices that include clips or other conductive plates with a solder connection to one or more semiconductor dies. Moreover, the disclosed examples achieve these advantages at lower cost than alternative solutions such as higher solder volume or incorporating a dimple on the clip contact.

Figure 4:
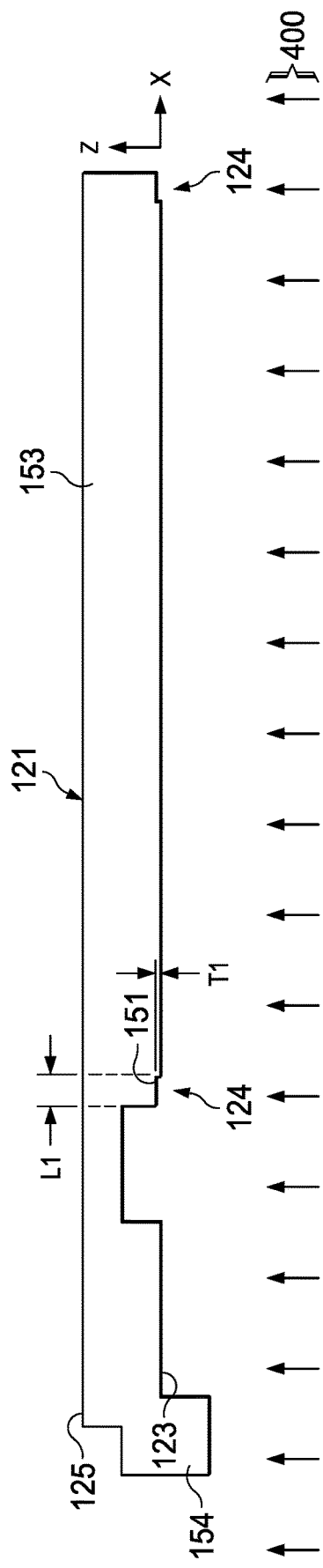
FIG. 4 is a partial end elevation view of a first conductive plate undergoing a coining operation to create an indent by forming a first step in a bottom first side of the first conductive plate.
Figure 5:
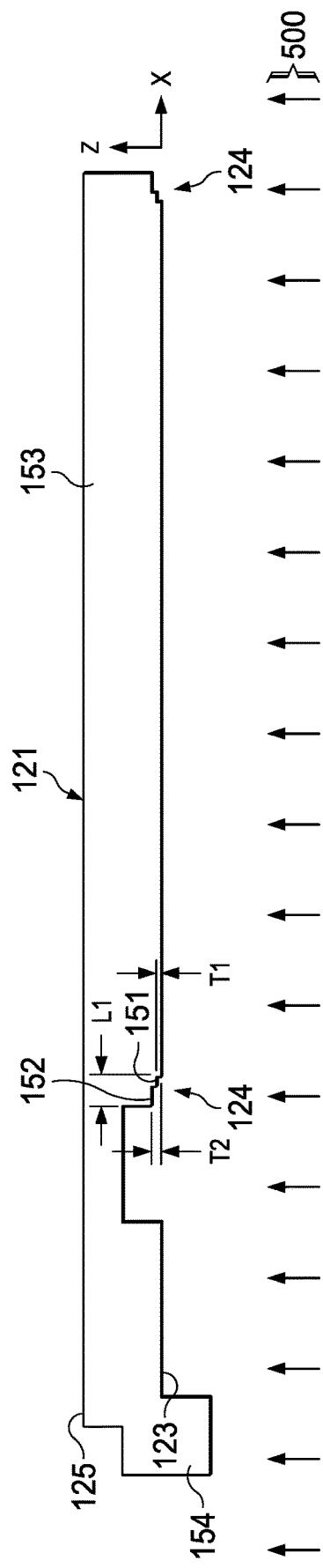
FIG. 5 is a partial end elevation view of the first conductive plate undergoing a second coining operation to form a second step in the first side of the first conductive plate.

Referring now to FIGS. 3-18, FIG. 3 shows a method 300 of manufacturing a packaged electronic device according to another embodiment and FIGS. 4-18 show the example packaged electronic device 100 at various states of fabrication according to the method 300. The method 300 includes forming an indent in a side of a conductive plate at 302. FIG. 4 shows the first conductive plate 121 undergoing a first coining process 400 to create the indent 124 that extends into the first side 123 of the first portion 153 along the direction Z. The first coining process 400 forms the first step 151 along multiple lateral edges to a first distance T1 in the bottom first side 123 of the first portion 153 of the first conductive plate 121. In another example, a stamping process is used. In another example, an etching process is used with a corresponding etch mask. FIG. 5 shows the first conductive plate 121 undergoing a second coining process 500 that forms the second step 152 along multiple lateral edges to the second distance T2 in the bottom first side 123 of the first portion 153 of the first conductive plate 121 adjacent the first step 151. In the illustrated example, the processing at 302 is repeated to form the second indent 126 in the first side 127 of the first portion 163 of the second conductive plate 122. The conductive plates 121 and 122 are thereafter used in the fabrication process 300 as described further below.

The method 300 continues at 304 with locating a lead frame strip on an adhesive carrier tape. FIG. 6 shows a partial end view of a pick and place location process 600 that positions a portion of a lead frame with the above described die attach pad 104, tie bars 105 and leads 103 and 108 on a carrier tape 602. The first semiconductor die 111 with the low side FET is attached to the die attach pad 104 at 306 in FIG. 3. FIG. 7 shows the first semiconductor die 111 attached to the die attach pad 104 of the starting lead frame via a pick and place attachment process 700. In one example, the die attachment at 306 includes dispensing or screening adhesive solder paste onto a portion of the second side 107 of the die attach pad 104 and placing the first side 114 of the first semiconductor die 111 on the solder paste, followed by thermal processing to solder the conductive source contact 171 to the die attach pad 104. At 308, the third semiconductor die 113 is attached to another portion of the die attach pad 104 using the same or similar die attach process 800, which is not seen in the view of FIG. 8 but is shown in FIG. 1 above.

Figure 8:
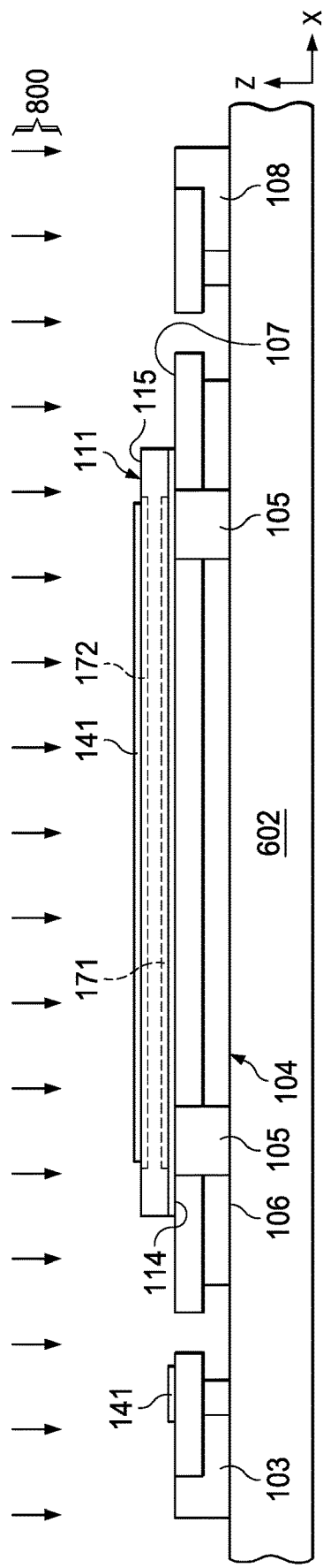
FIG. 8 is a partial end elevation view of a first solder structure dispensed on a top side of the first semiconductor die and onto a first lead of the lead frame.

The method 300 continues at 310 with depositing solder on the second side of the first semiconductor die 111. FIG. 8 shows the first solder structure 141 (e.g., solder paste) dispensed on the second side 115 of the first semiconductor die 111 using a deposition process 800 that also deposits a second portion of the first solder structure 141 onto the first lead 103.

Figure 9:
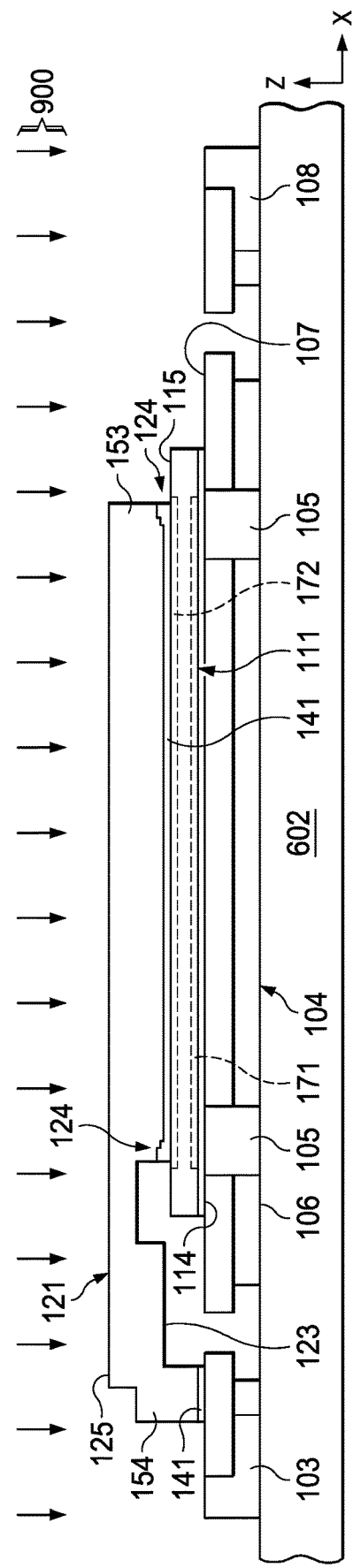
FIG. 9 is a partial end elevation view of a first portion of the first conductive plate engaging the dispensed first solder structure on the top side of the first semiconductor die, and a leg portion of the first conductive plate engaging the dispensed first solder structure on the first lead.

At 312, the method 300 continues with placing the first conductive plate onto the first solder on the first semiconductor die 111 and the first lead 103. FIG. 9 shows a pick and place process 900 that engages the first side 123 of the first conductive plate 121 with the first portion of the first portion of deposited solder to form the solder structure 141 that extends between the second side 115 of the semiconductor die 111 and the first side 123 of the first conductive plate 121, where the first portion of the first solder structure 121 extends into the indent 124. The placement process 900 also engages the lower side of the leg portion 154 of the first conductive plate 121 with the first solder 141 on the first lead 103 as shown in FIG. 9. The process 900 engages the first portion 153 of the first conductive plate 121 to the dispensed first solder structure 141 on the top or second side 115 of the first semiconductor die, and engages the leg portion 154 of the first conductive plate 121 to the dispensed first solder structure 141 on the first lead 103.

In one example, the structure is heated at 314 to reflow the first solder structure 141 to electrically couple the conductive plate 121 to the second terminal 172 exposed along the second side 115 of the first semiconductor die 111. In another example, the structure is heated after further placement operations.

The method 300 continues at 316 with depositing a second solder on the second side 125 of the conductive plate 121. FIG. 10 shows a deposition process 1000 that dispenses the second solder structure 142 on a portion of the top or second side 125 of the first portion 153 of the first conductive plate 121. The method 300 continues at 318 with engaging the first side 118 of the second semiconductor die 112 with the second solder structure. FIG. 11 shows a pick and place process 1100 that engages the first side 118 and the conductive first terminal 181 of the second semiconductor die 112 to the top or second side 125 of the first portion 153 of the first conductive plate 121. This provides the second solder structure 142 that extends between the first side 118 of the second semiconductor die 112 and the second side 125 of the conductive plate 121. At 320, the structure is heated to reflow the second solder structure 142 to electrically couple the conductive plate 121 to the second terminal 182 exposed along the first side 118 of the second semiconductor die 112. In another example, the structure is heated after further placement operations.

Figure 12:
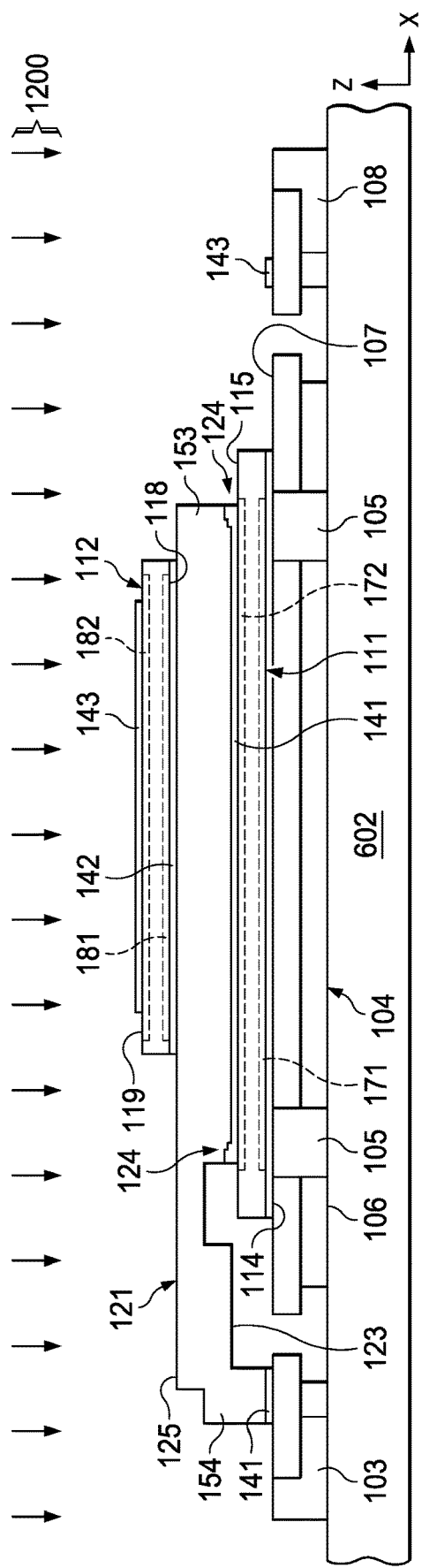
FIG. 12 is a partial end elevation view of a third solder structure dispensed on a top side of the second semiconductor die and onto a second lead of the lead frame.

The method 300 continues at 322 with depositing the third solder 143 on the top or second side 119 of the second semiconductor die 112. FIG. 12 shows a deposition process 1200 that dispenses the third solder structure 143 on the top or second side 119 of the second semiconductor die 112 and onto the second lead 108 of the lead frame.

Figure 13:
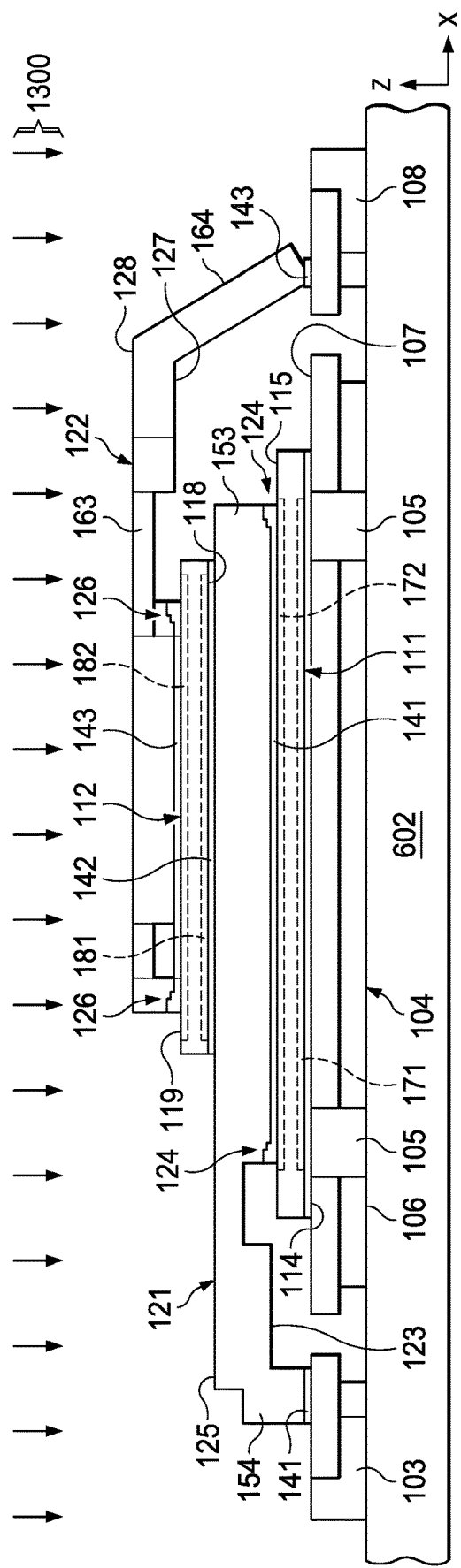
FIG. 13 is a partial end elevation view of a first portion of a second conductive plate engaging the dispensed third solder structure on the top side of the second semiconductor die, and a leg portion of the second conductive plate engaging the dispensed third solder structure on the second lead.

At 324, the second conductive plate 122 is placed onto the deposited third solder structure 143. FIG. 13 shows a pick and place process 1300 that engages the first portion 163 of the second conductive plate 122 to the dispensed third solder structure 143 on the second side 119 of the second semiconductor die 112. The process 1300 also engages the leg portion 164 of the second conductive plate 122 to the dispensed third solder structure 143 on the second lead 108. The process 1300 forms the third solder structure 143 that extends between the second side 119 of the second semiconductor die 112 and the first side 127 of the second conductive plate 122, and the third solder structure 143 also extends into the second indent 126. Moreover, the second portion of the third solder structure 143 extends between the bottom of the leg portion 164 and the second lead 108.

Figure 14:
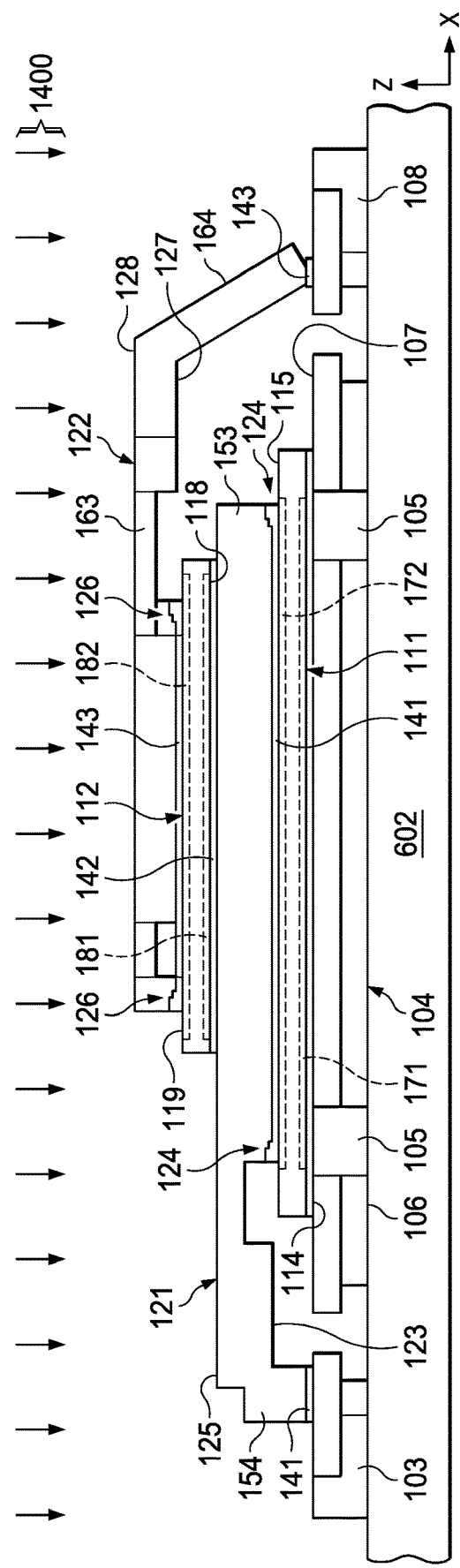
FIG. 14 is a partial end elevation view showing the lead frame, the semiconductor dies and the conductive plates undergoing a thermal process to reflow the solder structures.

Referring also to FIG. 14, the method 300 continues at 326 with heating the first solder 141 using a thermal process 1400 to reflow the respective first, second and third solder structures 141, 142 and 143. The thermal process 1400 in one example reflows the first solder structure 141 to electrically couple the first conductive plate 121 to the second terminal 172 exposed along the second side 115 of the first semiconductor die 111. The process 1400 also heats the second solder structure 142 and the third solder structure 143 to electrically couple the first conductive plate 121 to the first terminal 181 exposed along the first side 118 of the second semiconductor die 112, and to electrically couple the second conductive plate 122 to the second terminal 182 of the second semiconductor die 112. The thermal process 1400 in one example also reflows solder that connects the first and third semiconductor dies 111 and 113 to the die attach pad 104.

Figure 15:
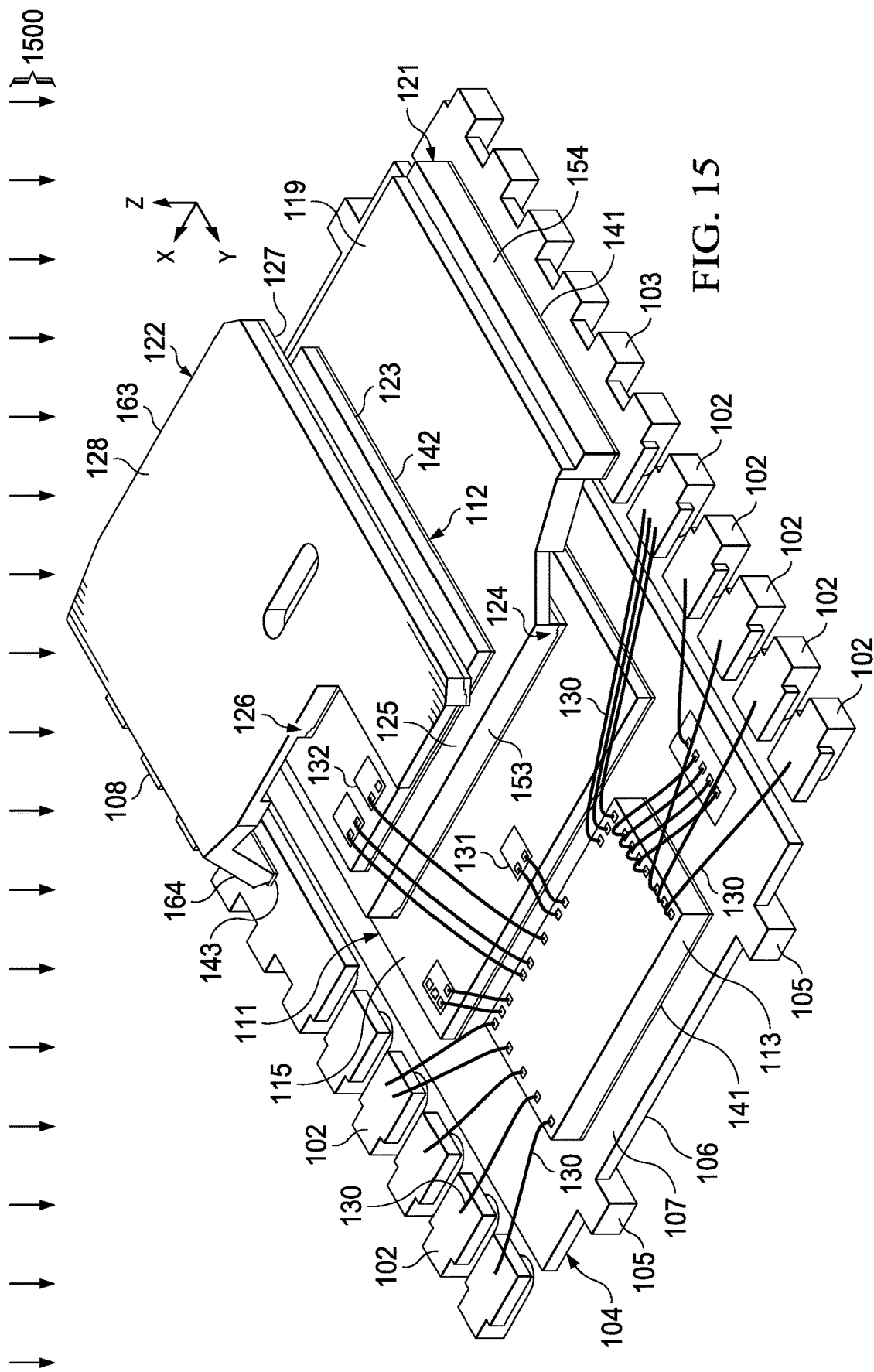
FIG. 15 is a perspective view showing a wire bonding process.
Figure 16:
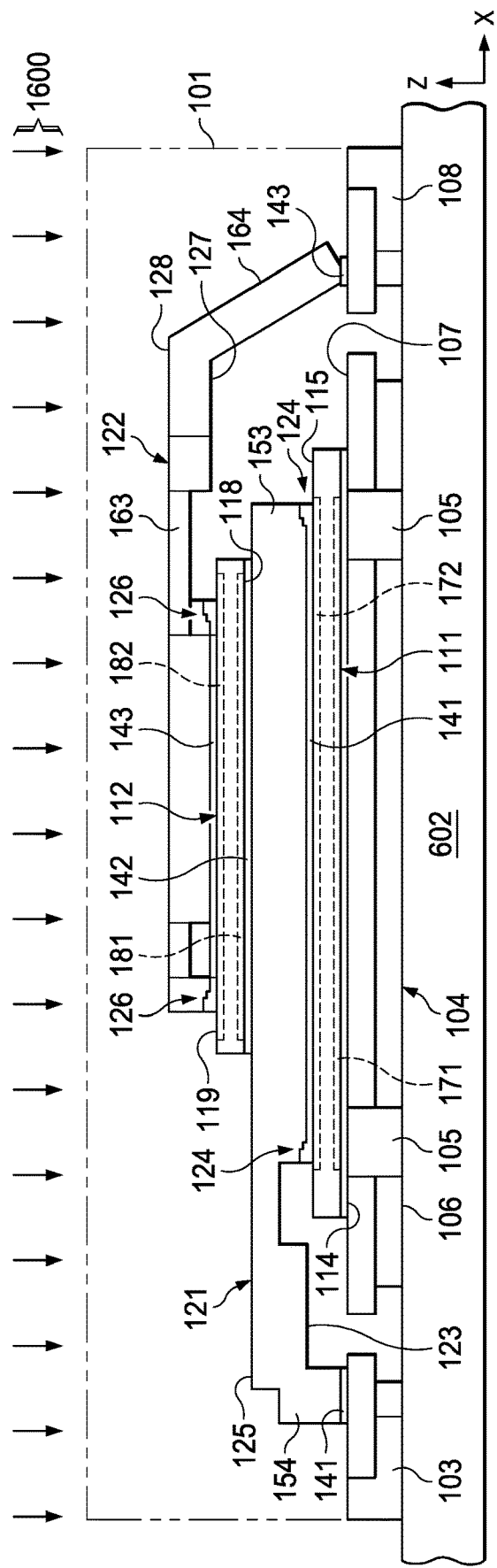
FIG. 16 is a partial end elevation view showing a molding process that forms a package structure to enclose the semiconductor dies, the conductive plates and portions of the leads.
Figure 17:
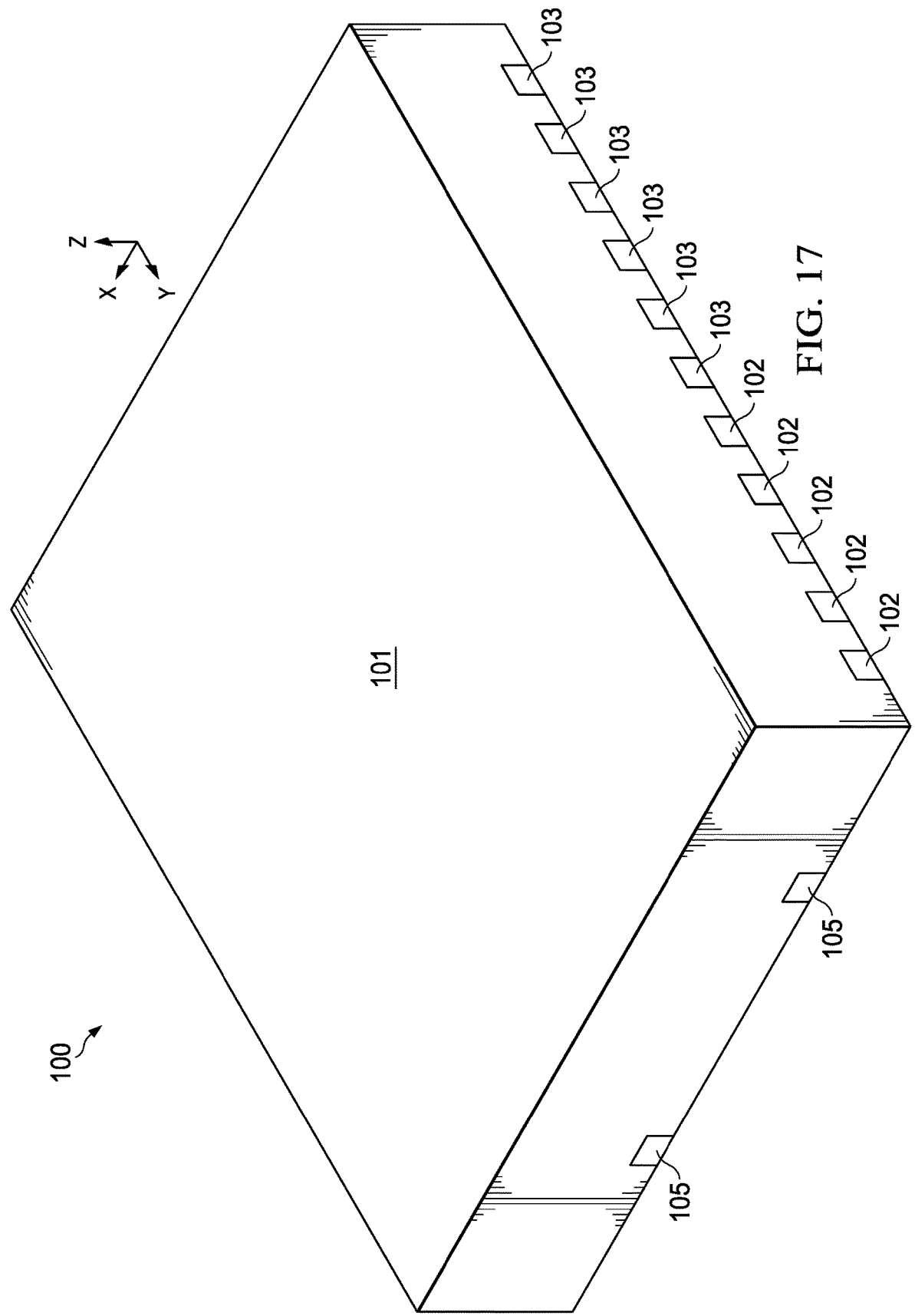
FIG. 17 is a top perspective view of the packaged electronic device.
Figure 18:
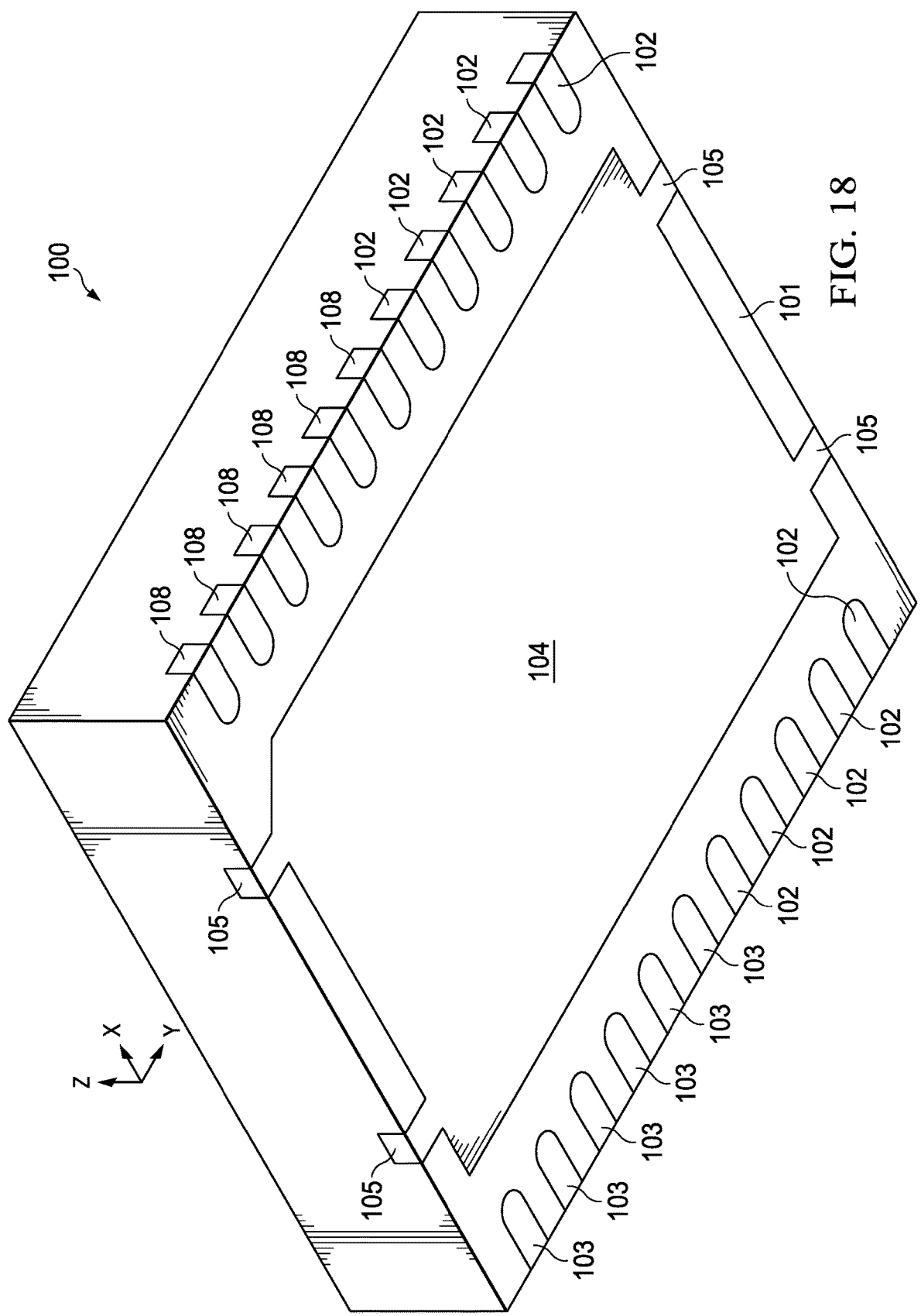
FIG. 18 is a bottom perspective view of the packaged electronic device.

The method 300 continues at 328 with wire bonding. FIG. 15 shows a wire bonding process 1500 that connects bond wires 130 to electrically couple various conductive features 131 and 132 (e.g., bond pads) of the semiconductor dies 111, 112 and 113 with one another and with respective ones of the leads 102. At 330, the method 300 continues with a molding process 1600 as shown in FIG. 16. The molding process 1600 forms the package structure 101 that encloses the semiconductor dies 111 and 112 and the conductive plates 121 and 122 and portions of the leads 102, 103 and 108, and exposes portions of the leads 102, 103 and 108, the bottom of the die attach pad 104 and portions of the tie bars 105. The process 300 thereafter includes package separation or singulation at 332, for example, saw cutting (not shown) to separate finished packaged electronic devices 100 from one another. FIG. 17 shows a top view of the finished the packaged electronic device 100 and FIG. 18 shows a bottom view of the packaged electronic device 100. The indents 124 and 126 in the conductive plates 121 and 122 provide a stress reduction feature in clip-to-die contact to reduce the solder joint damage and delay or prevent crack initiation, particularly during thermal process in manufacturing.

Modifications are possible in the described examples, and other implementations are possible, within the scope of the claims.

The invention claimed is:

1. A packaged electronic device, comprising:
    a semiconductor die having a first side, an opposite second side and a terminal exposed along the second side of the semiconductor die;
    a conductive plate having a first side, an opposite second side and an indent, the indent extends into the first side, the conductive plate electrically coupled to a lead;
    a solder structure that extends between the second side of the semiconductor die and the first side of the conductive plate to electrically couple the conductive plate to the terminal exposed along the second side of the semiconductor die, the solder structure extends into the indent; and
    a package structure that encloses the semiconductor die, the conductive plate and a portion of the lead, the package structure exposes a portion of the lead.

2. The packaged electronic device of claim 1, wherein the indent includes a step that extends into the first side of the conductive plate.

3. The packaged electronic device of claim 2, wherein:
    the step extends into the first side of the conductive plate by a first distance; and
    the indent includes a second step adjacent the step, the second step extends into the first side of the conductive plate by a second distance, and the second distance is greater than the first distance.

4. The packaged electronic device of claim 3, wherein:
    the second step extends to a lateral edge of the conductive plate; and
    the solder structure extends laterally to the lateral edge of the conductive plate between the second side of the semiconductor die and the first side of the conductive plate.

5. The packaged electronic device of claim 1, further comprising:
    a second semiconductor die having a first side, an opposite second side, a first terminal, and a second terminal, the first terminal exposed along the first side of the second semiconductor die, and the second terminal exposed along the second side of the second semiconductor die;
    a second conductive plate having a first side, an opposite second side and a second indent, the second indent extends into the first side, the second conductive plate electrically coupled to a second lead;
    a second solder structure that extends between the first side of the second semiconductor die and the second side of the conductive plate to electrically couple the conductive plate to the first terminal of the second semiconductor die; and
    a third solder structure that extends between the second side of the second semiconductor die and the first side of the second conductive plate to electrically couple the second conductive plate to the first terminal of the second semiconductor die, the third solder structure extends into the second indent;
    wherein the package structure encloses the second semiconductor die, the second conductive plate and a portion of the second lead, and the package structure exposes a portion of the second lead.

6. The packaged electronic device of claim 5, wherein the second indent includes a step that extends into the first side of the second conductive plate.

7. The packaged electronic device of claim 6, wherein:
    the step extends into the first side of the second conductive plate by a first distance; and
    the second indent includes a second step adjacent the step, the second step extends into the first side of the second conductive plate by a second distance, and the second distance is greater than the first distance.

8. A method of manufacturing a packaged electronic device, the method comprising:
    forming an indent in a side of a conductive plate;
    depositing solder on a side of a semiconductor die;
    engaging the side of the conductive plate with the solder to form a solder structure that extends between the side of the semiconductor die and the side of the conductive plate, the solder structure extends into the indent;
    heating the solder to electrically couple the conductive plate to a terminal exposed along the side of the semiconductor die; and
    forming a package structure that encloses the semiconductor die and the conductive plate.

9. The method of claim 8, wherein forming the indent in the side of the conductive plate comprises:
    forming a step that extends into the first side of the conductive plate.

10. The method of claim 9, wherein:
    the step extends into the first side of the conductive plate by a first distance; and
    forming the indent in the side of the conductive plate further comprises forming a second step adjacent the step, the second step extends into the first side of the conductive plate by a second distance, and the second distance is greater than the first distance.

11. The method of claim 10, wherein:
the second step extends to a lateral edge of the conductive plate; and
the solder structure extends laterally to the lateral edge of the conductive plate between the side of the semiconductor die and the side of the conductive plate.

12. The method of claim 8, further comprising:
forming a second indent in a side of a second conductive plate;
depositing a second solder on a second side of the conductive plate;
engaging a first side of a second semiconductor die with the second solder to form a second solder structure that extends between the first side of the second semiconductor die and the second side of the conductive plate;
depositing a third solder on a second side of the second semiconductor die;
engaging the side of the second conductive plate with the third solder to form a third solder structure that extends between the second side of the second semiconductor die and the side of the second conductive plate, the third solder structure extends into the second indent;
heating the second solder and the third solder to electrically couple the conductive plate to a first terminal exposed along the first side of the second semiconductor die, and to electrically couple the second conductive plate to a second terminal of the second semiconductor die.

13. The method of claim 12, wherein forming the second indent in the side of a second conductive plate comprises:
forming a step that extends into the side of the second conductive plate.

14. The method of claim 13, wherein:
the step extends into the side of the second conductive plate by a first distance; and
forming the second indent in the side of the second conductive plate further comprises forming a second step adjacent the step, the second step extends into the side of the second conductive plate by a second distance, and the second distance is greater than the first distance.

15. A conductive plate, comprising:
a first portion having a first side in a first plane and an opposite second side in a second plane, the first and second planes parallel to one another, and the second side spaced apart from the first side along a direction orthogonal to the first and second planes;
a leg portion extending along a leg direction from the first portion past the first plane and away from the second plane; and
an indent that extends into the first side of the first portion along the direction.

16. The conductive plate of claim 15, wherein the indent includes a step that extends into the first side of the conductive plate.

17. The conductive plate of claim 16, wherein:
the step extends into the first side of the first portion of the conductive plate by a first distance; and
the indent includes a second step adjacent the step, the second step extends into the first side of the first portion of the conductive plate by a second distance, and the second distance is greater than the first distance.

18. The conductive plate of claim 15, wherein the second step extends to a lateral edge of the conductive plate.

19. The conductive plate of claim 15, wherein the leg direction is parallel to the direction.

20. The conductive plate of claim 15, wherein the leg direction is at a non-zero angle to the direction.

21. A packaged electronic device, comprising:
a conductive plate having a first side, an opposite second side and an indent, the indent extends into a first side of a semiconductor die, the conductive plate electrically coupled to a lead;
a solder structure that extends between a second side of the semiconductor die and the first side of the conductive plate to electrically couple the conductive plate to the terminal exposed along the second side of the semiconductor die, the solder structure extends into the indent; and
a package structure that encloses the semiconductor die, the conductive plate and a portion of the lead, the package structure exposes a portion of the lead.

22. The packaged electronic device of claim 21, wherein the indent includes a step that extends into the first side of the conductive plate.

23. The packaged electronic device of claim 22, wherein:
the step extends into the first side of the conductive plate by a first distance; and
the indent includes a second step adjacent the step, the second step extends into the first side of the conductive plate by a second distance, and the second distance is greater than the first distance.

24. The packaged electronic device of claim 23, wherein:
the second step extends to a lateral edge of the conductive plate; and
the solder structure extends laterally to the lateral edge of the conductive plate between the second side of the semiconductor die and the first side of the conductive plate.

25. The packaged electronic device of claim 21, further comprising:
a second semiconductor die having a first side, an opposite second side, a first terminal, and a second terminal, the first terminal exposed along the first side of the second semiconductor die, and the second terminal exposed along the second side of the second semiconductor die;
a second conductive plate having a first side, an opposite second side (128) and a second indent, the second indent extends into the first side, the second conductive plate electrically coupled to a second lead;
a second solder structure that extends between the first side of the second semiconductor die and the second side of the conductive plate to electrically couple the conductive plate to the first terminal of the second semiconductor die; and
a third solder structure that extends between the second side of the second semiconductor die and the first side of the second conductive plate to electrically couple the second conductive plate to the first terminal of the second semiconductor die, the third solder structure extends into the second indent;
wherein the package structure encloses the second semiconductor die, the second conductive plate and a portion of the second lead, and the package structure exposes a portion of the second lead.

26. The packaged electronic device of claim 25, wherein the second indent includes a step that extends into the first side of the second conductive plate.

27. The packaged electronic device of claim 26, wherein:
the step extends into the first side of the second conductive plate by a first distance; and the second indent includes a second step adjacent the step, the second step extends into the first side of the second conductive plate by a second distance, and the second distance is greater than the first distance.

28. The packaged electronic device of claim 1, wherein the indent occupies a portion of the first side and a portion of another side of the conductive plate.

29. The method of claim 8, wherein the indent occupies a portion of the first side and a portion of another side of the conductive plate.

30. The conductive plate of claim 15, wherein the indent occupies a portion of the first side and a portion of another side of the conductive plate.

* * * * *